United States Patent [19]

Van Dyk, Jr.

[11] 4,399,317

[45] Aug. 16, 1983

[54] SEALING APPARATUS FOR RADIO FREQUENCY SHIELDING ENCLOSURE

[75] Inventor: Garritt C. Van Dyk, Jr., Bethel, Conn.

[73] Assignee: Keene Corporation, Norwalk, Conn.

[21] Appl. No.: 303,390

[22] Filed: Sep. 18, 1981

[51] Int. Cl.³ .............................................. H05K 9/00
[52] U.S. Cl. ................................ 174/35 GC; 49/477; 277/34
[58] Field of Search ............... 174/35 GC, 35 MS; 49/477; 220/232; 277/34, 34.3, 34.6

[56] References Cited

U.S. PATENT DOCUMENTS

| | | | |
|---|---|---|---|
| 2,757,225 | 7/1956 | Dunn | 174/35 |
| 3,055,969 | 9/1962 | Schaller | 174/35 |
| 3,260,788 | 7/1966 | Stetson | 174/35 |
| 3,413,406 | 11/1968 | Plummer | 174/3 |
| 3,437,735 | 4/1969 | Schaller | 174/35 |
| 3,507,974 | 4/1970 | Clark | 174/35 |
| 3,518,355 | 6/1970 | Luce | 174/35 |
| 3,691,688 | 9/1972 | Kaiserswerth | 49/394 |
| 3,889,043 | 6/1975 | Ducros | 174/35 GC |
| 3,969,572 | 7/1976 | Rostek | 174/35 MS |
| 4,065,138 | 12/1977 | Severinsen | 277/230 |
| 4,098,633 | 7/1978 | Kersten | 156/245 |
| 4,177,353 | 12/1979 | McCormack | 174/35 GC |

Primary Examiner—A. T. Grimley
Assistant Examiner—D. A. Tone
Attorney, Agent, or Firm—Pennie & Edmonds

[57] ABSTRACT

An electrically conductive rectangular housing contains a conductive elastomeric tube with a resilient core material. The housing also contains an inflatable seal which is preferably a flattened inflatable elastomeric member. Inflation of the elastomeric member causes the minor axis of the seal to become elongate, compressing the tube into conductive contact with sections of the enclosure and forcing a part of the tube from a slot in the housing and into contact with the surface of a conductive section of the enclosure disposed opposite the slot. Upon deflation, the seal returns to its uninflated shape due to its "memory" characteristic, thus permitting the conductive tube to withdraw from contact with the conductive section opposite the slot and assume its unextruded shape.

11 Claims, 8 Drawing Figures

SEALING APPARATUS FOR RADIO FREQUENCY SHIELDING ENCLOSURE

TECHNICAL FIELD

This invention relates to the field of radio frequency shielding. More particularly it relates to the field of devices which provide an electrically conductive seal between adjacent conductive sections of a shielding enclosure such as, for example, the walls or a door frame and a hinged or sliding door.

BACKGROUND ART

A major problem associated with the use of an electromagnetic or radio frequency shielding enclosure is the loss of shielding effectiveness at the space between the door providing access to the enclosure and the door frame. Several approaches to providing a continuous electrically conducting medium between the door and the door frame have been used in the past. One such approach involves the use of brass finger stock which may be configured to contact a knife-edge extension of the door, the finger stock being electrically connected to the door frame which is in turn electrically connected to the wall. Another approach involves the use of opposed conductive panels to form a door assembly which slides on rollers within the door frame. Inflatable bladders between the panels of the assembly force the panels away from each other and into contact with the door frame as disclosed in U.S. Pat. No. 3,518,355 to Luce.

Another common approach involves the use of specially prepared gaskets between the door and door frame. A tubular mesh gasket may be flattened between the door and frame by the application of force thus exerting pressure on the gasket and maximizing the electrical conductivity through the door surface, gasket and frame structure (see U.S. Pat. No. 3,055,969 to Schaller). If permanent deformation or flattening of this gasket occurs due to loss of resiliency with continued use electromagnetic radiation may leak through the seal. Yet another approach is illustrated in U.S. Pat. No. 3,507,974 to Clark. Inflatable tubing is used to bend flexible finger stock, which is electrically connected to the door structure, into contact with the frame.

A discussion of the disadvantages inherent in these approaches can be found in U.S. Pat. No. 4,177,353 to McCormack. McCormack proposes to seal the gap around a door, in an electromagnetic shielding enclosure with an inflatable, tubular conductive gasket which is confined within a rigid, conductive channel having a semi-circular cross section and recessed within the frame around the door. The gasket proposed by McCormack has a sleeve or coating of conductive material over the tube. Upon inflation of this gasket the surface thereof is forced into good conductive contact with the interior of the channel in which the gasket is confined. A minor part of the gasket is not confined within the channel and, when the gasket is inflated, emerges through the open portion of the channel and, within the limits of the channel geometry and the gasket material, is capable of extruding beyond the surface of the frame in which the channel is recessed. If the adjacent surface of the door that the gasket is to contact is fairly true and in good alignment with the emergent portion of the gasket and if the adjacent surface is nowhere beyond the reach of that small emergent part of the gasket, it should be possible to make an effective seal across the gap between the frame and the door. However, the geometry of the rigid channel and the characteristics of the gasket material impose narrow limits on the ability of McCormack's seal to accommodate misalignment and variations in the gap between the frame and the door. It appears to be useful only in relatively small shielding enclosures where dynamic conditions of every day use do not work to distort the designed alignment and gap distance between the adjacent members of the shielding enclosure.

While these approaches are somewhat useful, it will be appreciated by one skilled in the art that relatively large and uneven gaps generally exist between the mating surfaces of large doors or between such doors and the adjacent surface of the surrounding frame. These gaps occur because it is extremely difficult to hold manufacturing tolerances accurately over large distances, such as the typical dimensions of the doorways of aircraft hangers which must be sealed against radio frequency leakage without incurring excessive costs. Furthermore, even if dimensions are accurately controlled, the great weight of such large doors will make it difficult to maintain the doors in proper alignment during use. Misalignment will inevitably result in gaps which vary in dimension with position along the edge of the door. If an attempt is made to use precise tolerances, such misalignment may prevent the doors from closing. Thus, attempts to reduce the size of such gaps and to keep them of uniform size so that the prior art electromagnetic seals may be effective would be expensive and involve continuing mechanical maintenance.

DISCLOSURE OF THE INVENTION

The present invention solves this problem by providing an electrically conductive seal between conductive sections of a shielding enclosure by the use of a conductive elastomeric tube which can bridge and conform to such large and uneven gaps. A conductive housing of rectangular cross section is secured to and aligned in close proximity to or upon the periphery of a first one of the conductive sections. The conductive elastomeric tube, of a generally circular cross section and of a diameter approximately equal to the length of a shorter side of the rectangular cross section of the housing is disposed within the housing. This conductive elastomeric tube has a highly resilient elastomeric core. A slot, aligned in the direction of the elastomeric tube along the length of the housing and having a width approximately equal to that of the elastomeric tube, is provided in a longer side of the rectangular housing in facing relationship to a surface of the second conductive section. An inflatable elastomeric seal or member is disposed in the housing parallel to the conductive elastomeric tube.

Means for inflating and deflating the seal is provided. Inflation of the seal causes the conductive elastomeric tube to be compressed and a portion to be forced from or "extruded" from the slot and into mechanical and electrical contact with a second enclosure section. The conductive elastomeric tube thus comprises a continuous electrically conducting medium in contact with the second enclosure section and the internal surface of the housing which is in turn in contact with the first enclosure section. Since the housing is conductive, continuous electrical contact is provided between the first and the second sections of the enclosure, when the seal or member is inflated. When the seal is deflated, the conductive elastomeric tube assumes its uncompressed generally circular cross section and returns to a position largely within the housing. The elastomeric seal is preferably a flattened member with a cross section having a major axis and a minor axis. When the seal is inflated the minor axis becomes elongate compressing the elastomeric tube. When the member is deflated it assumes its flattened shape due to the "memory" characteristics of the seal.

The seal may comprise a flat base parallel to, in contact with and preferably secured to an internal surface of the rectangular housing. A connecting portion which is perpendicular to the base extends from the base to the flattened portion.

BRIEF DESCRIPTION OF THE DRAWINGS

The objects and advantages of the invention are described in the following specification and drawings in which.

DETAILED DESCRIPTION OF THE INVENTION

A major problem associated with the testing and maintenance of radar systems, or other electronic equipment which produces radio frequency emissions is interference with the operation of other nearby electronic equipment. In addition sensitive electronic equipment must often be protected from stray electromagnetic radiation during testing, maintenance or use of such equipment.

A common way to solve these problems is to provide radio frequency or electromagnetic shielding. When the equipment is an emitter of radiation, it can be placed temporarily in a shielding enclosure to prevent stray radiation from causing interference to nearby equipment during testing or maintenance.

As outlined above, a difficulty associated with shielding enclosures is providing a good radio frequency seal between the door (or doors) and the wall of such an enclosure. In some applications these doors may be quite large. For example, in the case of aircraft hanger doors it would not be unusual for the doors to be approximately 50 feet high and each 25 feet across. If these doors are to be part of an electromagnetic shielding hanger in which, for example, the radar or other systems installed on an aircraft may be maintained and tested without interference from electromagnetic emissions originating outside the hanger or to confine to the hanger those emissions generated by the systems on the aircraft it is required that the doors be constructed to have at least an electrically conductive exterior, that no openings exist in the doors through which electromagnetic radiation can penetrate and finally that the doors or more specifically, the conductive portions thereof are continuously electrically connected to the door frame, which is comprised of an electrically conductive material, about their periphery. The frame is of course electrically connected to the walls of the enclosure. Furthermore, the doors must be continuously electrically connected to one another.

Figure 1:
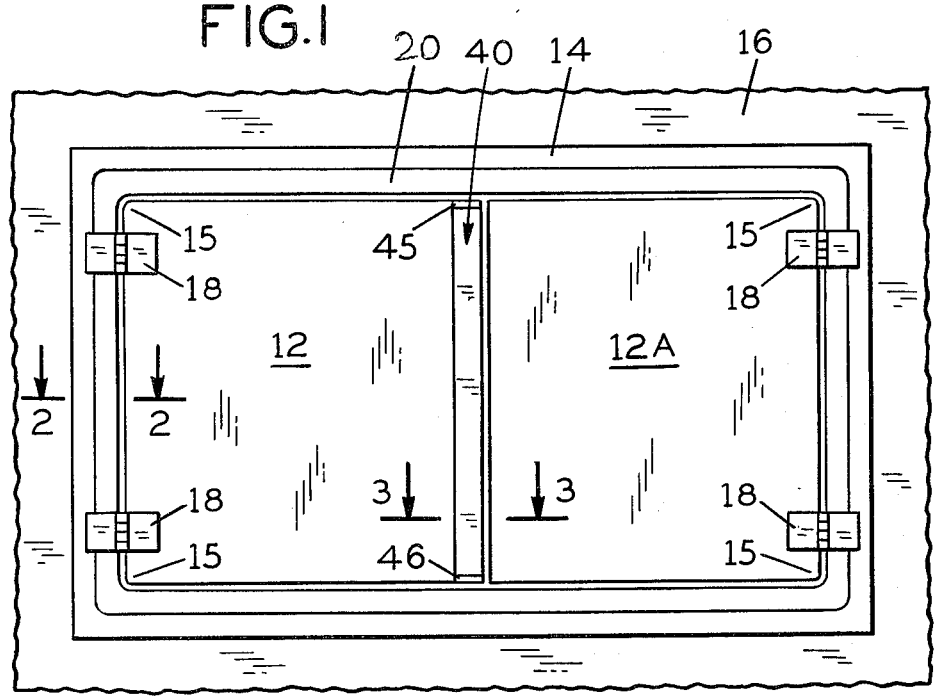
FIG. 1 illustrates a portion of a wall of an electromagnetic shielding enclosure having an opening or door frame closed by two outwardly opening hinged rectangular doors.

Referring to FIG. 1, a pair of such hinged doors 12 and 12A are mounted to frame 14 of a wall 16 of a shielding enclosure by hinges 18. Doors 12 and 12A open by swinging outward from wall 16. These doors are secured in the closed position by a conventional latch mechanism (not shown).

As will be understood by one skilled in the art, doors 12 and 12A need not be comprised of solid metal plate to be adequate conductors. It is sufficient that a nonconducting core be encased by high conductivity metal sheets or meshes. These may be brass, copper, aluminum or other metals of reasonable cost which provide adequate shielding capabilities and performance for a given application. For simplicity, these doors will be shown in cross section as being comprised of a single metal plate throughout their entire thickness.

To assure proper shielding it is important that doors 12 and 12A are constructed according to the principles outlined above; that is with no openings through which electromagnetic radiation can escape or penetrate and with the conductive portions of doors 12 and 12A (or alternatively the periphery of frame 14) configured with a means for providing continuous electrical connection between frame 14 and the periphery of doors 12 and 12A. Frame 14 must of course be electrically connected to wall 16. In addition, a mean for providing continuous electrical connection between doors 12 and 12A must be provided.

Apparatus 20, a continuous member mounted on the periphery of door frame 14, and constructed according to the invention, is used to provide an electromagnetic seal between door frame 14 and the surfaces of doors 12 and 12A facing door frame 14. To provide proper electromagnetic sealing at the corners of frame 14 doors 12 and 12A are rounded at their corners 15 with apparatus 20 generally following the contour of corners 15 but spaced from these corners as shown.

Apparatus 40 provides an electromagnetic seal between the opposing or facing surfaces of doors 12 and 12A.

Figure 2:
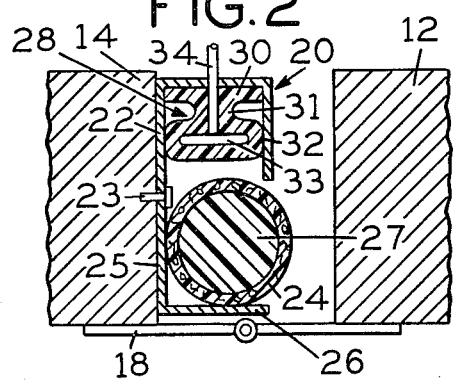
FIGS. 2 and 2A, taken along line 2—2 of FIG. 1, illustrate the apparatus of the invention with the inflatable elastomeric seal deflated and inflated respectively.

Referring to FIG. 2 apparatus 20 is comprised of an electrically conductive housing 22 of rectangular cross section. This housing may be electrically conductive due to the conductive nature of the material from which it is formed, or possibly due to the application of a conductive coating to a nonconductive base. While a longer side of the rectangle contacts frame 14, there are other applications of the invention in which apparatus 20 may be mounted to a conductive section of a shielding enclosure so that a shorter side of the rectangular housing contacts the surface of that section. Housing 22 is secured to frame 14 by means of a series of fasteners or screws 23 disposed through holes along the length of housing 22. Conductive elastomeric tube 24 is disposed within housing 22 so that it contacts side 25 and side 26 which is one of the shorter sides of the rectangular cross section. A portion of tube 24 protrudes from a slot in housing 22. The slot may be of a width approximately equal to but slightly smaller than the diameter of elastomeric tube 24 in order to retain tube 24 within housing 22. The slot is aligned along housing 22 in the direction of tube 24.

Tube 24 is comprised of a conductive elastomer which is typically a metal loaded material. For example, metallic copper particles may be disposed within a silicone rubber base to form tube 24. Thin conductive coatings on an elastomer which is not loaded with metal particles may also be used. A highly resilient elastomeric core 27 is provided for tube 24. It may be comprised of foam rubber, polyurethane foam or similar materials. By highly resilient it is meant a material which will not simply be compressed but when compressed in one direction will be forced to "extrude" in a direction perpendicular to that of the direction of compression. In addition, when the compressive force is released, conductive tube 24 will assume its generally circular cross sectional shape.

Also disposed within housing 20 is member or seal 28 comprising base portion 30 which is in contact with the shorter side of rectangular housing 20 opposite the side in contact with elastomeric tube 24. Connecting portion 31, perpendicular to base 30, extends from base 30 to flattened portion 32 which is an inflatable portion of seal 28. Portion 32 assumes the shape shown in FIG. 2 because of its "memory" characteristics, that is a tendency to return to the flat shape in which it is formed when internal pressure is released.

Cavity 33 of portion 32, which is preferably of a generally flattened or elongate shape extends along the length of seal 28. Tube 34, which may be one of several similar tubes, is provided for conducting a compressed fluid to cavity 33. Tube 34 serves as a passageway through which seal 28 is inflated by conducting fluid from a source such as a pump and deflated by releasing the compressed fluid from the passageway by for example a valve. The pump and valve may be of types well known in the art.

Figure 2A:
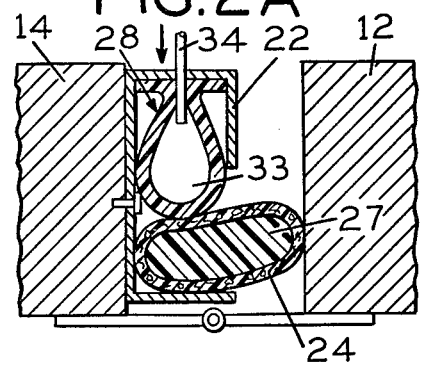

FIG. 2A shows seal 28 in its inflated condition as a result of pressurized fluid being forced into cavity 33 through tube 34. Tube 24 is compressed and forced to further extend outwardly through the slot in housing 22, thus contacting door 12 and providing a seal for electromagnetic radiation.

In theory, if tube 24 is compressed until it is completely flat, a gap of 1.57 ($\pi/2$) times the diameter of tube 27 may be sealed. In practice this theoretical limit is not reached. The largest gap which may be bridged is dependent on parameters such as the extent to which the dimensions of seal 28 may be varied by inflation and the compression characteristics or resiliency of elastomeric core 27.

When the compressed fluid forced into tube 34 is released from tube 34 and therefore from cavity 33, seal 28 resumes the elongate shape shown in FIG. 2 due to the "memory" characteristics of the elastomeric material, typically a rubber from which it is formed.

Figure 3:
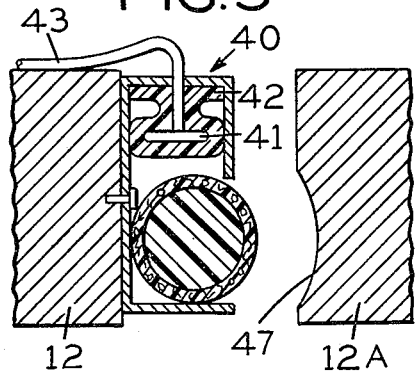
FIGS. 3 and 3A, taken along line 3—3 of FIG. 1, are similar to FIGS. 2 and 2A.

In FIG. 3, apparatus 40, of similar construction to apparatus 20, is used to provide an electromagnetic seal between the facing surfaces of doors 12 and 12A. Cavity 41 of seal 42 is inflated by compressed fluid which is conducted to and from seal 42 by tube 43. Tube 43 is conveniently secured to door 12 as it extends towards frame 14, at which point there must be a flexible portion of tube 43 to permit motion of door 12. A stationary extension of tube 43 then connects to a source of compressed fluid.

Seal 42 extends along the entire length of apparatus 40 which is configured with flat end plates 45 and 46 which seal the top and bottom ends of apparatus 40 (as shown in FIG. 1), thus providing a surface for tube 24 of apparatus 20 to contact when seal 28 is inflated. It will be understood by one skilled in the art that the top and bottom vertical extremes of cavity 41 must be closed off to permit inflation of seal 42 because seal 42 does not form a complete loop and close upon itself as does seal 28.

Figure 3A:
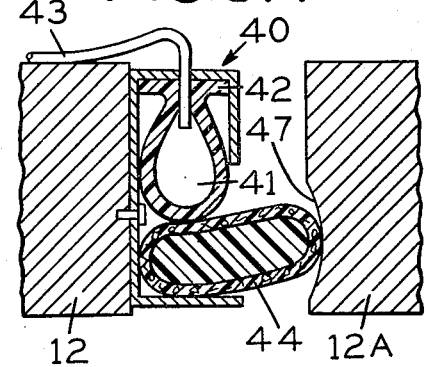

Referring to FIG. 3A, cavity 41 of seal 42 has been inflated. Conductive elastomeric tube 44, of identical construction to tube 24, is compressed and forced to extend towards the facing surface of door 12A. This facing surface may be provided with a shallow trough or cove 47 which is useful if the conditions of a particular installation tend to impose a transverse thrust on tube 44.

Figure 4:
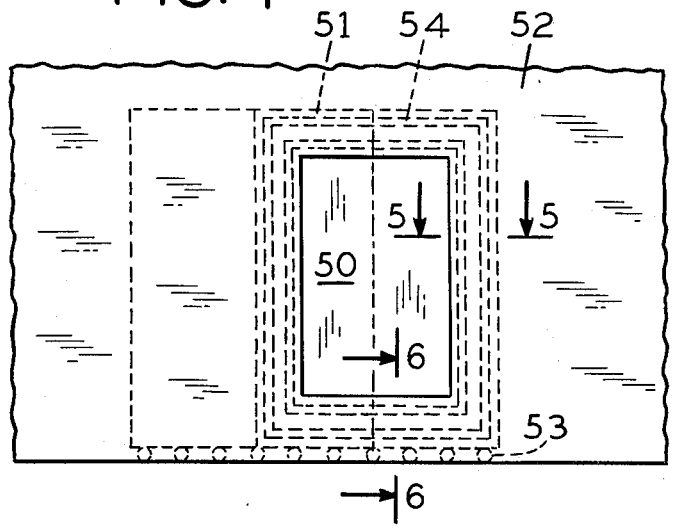
FIG. 4 illustrates a portion of the wall of an electromagnetic shielding enclosure having an opening which is closed by a sliding or "pocket" door.

Referring to FIG. 4 a "pocket" door 50 which slides within frame 51 of wall 52 of a shielding enclosure is illustrated. A series of rollers 53 on a rolling track of a type well known in the art are provided to facilitate the motion of door 50. An apparatus 54 according to the invention is used to provide an electrically conductive seal between a frame extension member and door 50.

Figure 5:
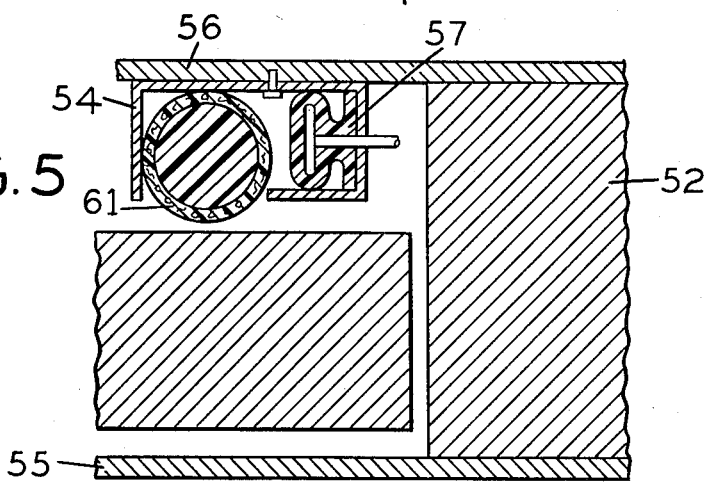
FIG. 5, taken along line 5—5 of FIG. 4, illustrates a sealing apparatus according to the invention mounted on the periphery of the door frame structure with the seal deflated.

Referring to FIG. 5, frame extension members 55 and 56 are in electrical contact with wall 52, which is shown as a metal slab, but as indicated above with respect to doors 12 and 12A, may be a nonconductor covered with an appropriate conductor. Sealing apparatus 54, a rectangular structure similar to apparatus 20 in that it closes upon itself forming a loop, is shown disposed between frame extension member 56, an internal frame component located within the electromagnetic shielding enclosure, and door 50. Seal 57 is shown in its deflated condition.

Figure 6:
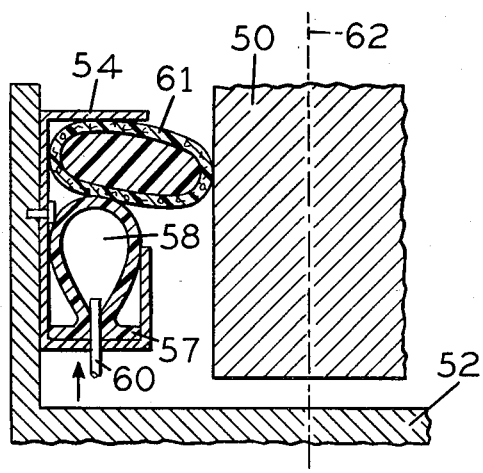
FIG. 6, taken along line 6—6 of FIG. 4, illustrates the sealing apparatus of the invention with the inflatable seal inflated and a portion of the conductive elastomeric tube "extruded" from the housing and forced into mechanical and electrical contact with the door.

Referring to FIG. 6, apparatus 54 is shown with seal 57 inflated as a result of compressed fluid being forced into cavity 58 through one or more tubes 60 thus forcing conductive elastomeric tube 61 to contact door 50. For simplicity, rollers 53 have not been shown between door 50 and wall 52. It is understood that an additional apparatus 54 may be used between external frame extension member 55 and the outside of door 50. FIG. 6 would then be symmetrical about line 62 which represents a plane parallel to the inside and outside surfaces of door 50. In other words, a mirror image of what is shown as being to the left of line 62 would also exist to the right of line 62. While not generally required this would assure adequate electromagnetic sealing in difficult applications. If even this is not adequate, frame member 56 can readily be extended and a second apparatus or structures 54 can be placed between frame member 56 and door 50, the second forming a closed loop within the first. This approach may also be used as a design alternative where the use of two apparatuses is desirable.

In operation, no seal is inflated until the door (or doors) is closed. Before the door may be opened pressure must be released and the inflatable seal deflated so that excessively large forces are not required to open the door and large shear forces are not created which could damage the conductive elastomeric tube.

While the invention has been described with respect to what is its chief area of application, which is providing an electromagnetic seal between the door and door frame of an electromagnetic shielding enclosure, it is recognized that it can be used to provide a seal between any two conductive sections of such an enclosure. While it is customary in a permanently erected structure to electrically connect the walls by permanent means as is well known in the art it is understood that the invention described above may be used to electrically connect two walls or the wall and ceiling of such an enclosure. This might be particularly useful in the case of a prefabricated structure which could be repeatedly assembled and disassembled.

In addition, while the invention is particularly useful for large structures, where there are large and uneven gaps between the conductive sections, it may in appropriate cases be applied to smaller structures such as the doors of cabinets used to shield radiofrequency transmitters.

Various other applications and modifications of the invention in addition to those described herein will become apparent to one skilled in the art from the above drawings and description which have been offered by way of illustration only and not in limitation of the invention, the scope of which is defined in the appended claims.

I claim:

1. An apparatus for providing an electrically conductive seal between a first conductive section and a second conductive section of a shielding enclosure comprising:
   (a) a conductive housing of rectangular cross section aligned and secured in close proximity to or upon the periphery of the first of said sections;
   (b) a conductive elastomeric tube of generally circular cross section with a diameter approximately equal to the length of a shorter side of said rectangular cross section disposed within said housing along the length of said housing;
   (c) a highly resilient elastomeric core disposed within said tube;
   (d) a longer side of said rectangular housing in facing relationship to a surface of said second conductive section having a slot aligned with said conductive elastomeric tube of a width approximately equal to but smaller than a diameter of said tube;
   (e) an inflatable elastomeric seal disposed in said housing parallel to said conductive elastomeric tube; and
   (f) means through which said seal is inflated and deflated whereby said conductive elastomeric tube is contacted by said seal and a portion of said tube is forced through said slot into contact with said second enclosure section when compressed by expansion of said inflatable seal and returns to a position substantially within said housing when said inflatable seal is deflated.

2. The apparatus of claim 1 wherein the inflatable elastomeric seal comprises a flattened portion with a section having a major and minor axis when it is not inflated, said seal being disposed with said major axis parallel to the shorter sides of said rectangular enclosure said minor axis becoming elongate and said major axis shortening when said seal is inflated.

3. The apparatus according to claim 2 wherein the seal is secured to an internal surface of said housing.

4. The apparatus of claim 3 wherein the seal comprises:
   (a) a flat base parallel to and in contact with said internal surface of said rectangular cross section; and
   (b) a connecting portion perpendicular to said base extending from said base to said flattened portion.

5. The apparatus of claim 1 wherein the seal is secured to an internal surface of said housing.

6. The apparatus of claim 5 wherein the seal comprises:
   (a) a flat base parallel to and in contact with said internal surface of said rectangular cross section; and
   (b) a connecting portion perpendicular to said base extending from said base to said flattened portion.

7. The apparatus of any of claims 1, 2, 3, 4, 5, or 6 in which the conductive elastomeric tube comprises an elastomer loaded with metal particles.

8. The apparatus of any of claims 1, 2, 3, 4, 5, or 6 in which the elastomeric core is comprised of foam rubber.

9. The apparatus of any of claim 1, 2, 3, 4, 5, or 6 disposed to provide a seal between a door and wall of said enclosure.

10. The apparatus of any of claims 1, 2, 3, 4, 5, or 6 wherein the means through which said seal is inflated and deflated comprises at least one tube or passageway through which fluid may be conducted into and released from said tube.

11. The apparatus of claim 10 wherein said tube or passageway through which compressed fluid is conducted to said tube is connected to a source of compressed fluid and a means for releasing said fluid from said tube or passageway.

* * * * *